(12) United States Patent
Espalin et al.

(10) Patent No.: US 11,317,515 B2
(45) Date of Patent: Apr. 26, 2022

(54) WIRE EMBEDDING SYSTEM WITH A CURVED DELIVERY PATH

(71) Applicant: The Board of Regents, The University of Texas System, Austin, TX (US)

(72) Inventors: David Espalin, El Paso, TX (US); Ryan Wicker, El Paso, TX (US); Alfonso Fernandez, El Paso, TX (US); Jorge Ramirez, El Paso, TX (US); Jose Motta, El Paso, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 922 days.

(21) Appl. No.: 15/695,828

(22) Filed: Sep. 5, 2017

(65) Prior Publication Data
US 2018/0070453 A1 Mar. 8, 2018

Related U.S. Application Data (60) Provisional application No. 62/383,761, filed on Sep. 6, 2016.

(51) Int. Cl.
| | |
|---|---|
| H05K 3/10 | (2006.01) |
| B29C 70/82 | (2006.01) |
| B33Y 50/02 | (2015.01) |
| H05K 3/00 | (2006.01) |
| H05K 1/11 | (2006.01) |
| B33Y 10/00 | (2015.01) |
| H05K 1/02 | (2006.01) |
| B33Y 30/00 | (2015.01) |

(52) U.S. Cl.
CPC ............. *H05K 3/103* (2013.01); *B29C 70/82* (2013.01); *B33Y 10/00* (2014.12); *B33Y 50/02* (2014.12); *H05K 1/0284* (2013.01); *H05K 1/119* (2013.01); *H05K 3/0014* (2013.01); *B33Y 30/00* (2014.12); *H05K 2201/026* (2013.01); *H05K 2201/0323* (2013.01); *H05K 2203/0195* (2013.01); *H05K 2203/1105* (2013.01); *H05K 2203/163* (2013.01)

(58) Field of Classification Search
CPC ...................................................... B29C 70/82
See application file for complete search history.

(56) References Cited

U.S. PATENT DOCUMENTS

| | | | |
|---|---|---|---|
| 10,254,499 B1* | 4/2019 | Cohen | B23K 1/19 |
| 2006/0156978 A1* | 7/2006 | Lipson | B29C 64/118 |
| | | | 118/708 |
| 2013/0170171 A1 | 7/2013 | Wicker et al. | |
| 2014/0268604 A1 | 9/2014 | Wicker et al. | |
| 2014/0268607 A1 | 9/2014 | Wicker et al. | |
| 2017/0064840 A1 | 3/2017 | Espalin et al. | |
| 2017/0066187 A1* | 3/2017 | Mark | B33Y 10/00 |

OTHER PUBLICATIONS

Bayless et al., 2010, Wire Embedding 3D Printer.*

* cited by examiner

*Primary Examiner* — Alison L Hindenlang
*Assistant Examiner* — Asha A Thomas
(74) *Attorney, Agent, or Firm* — Yee & Associates, P.C.

(57) ABSTRACT

A method for embedding a line in a substrate. A line embedding head in positioned relative to a surface of the substrate. The line from an output port in the line embedding head is output at an angle relative to the embedding head such that the line is embedded in the substrate.

17 Claims, 7 Drawing Sheets

WIRE EMBEDDING SYSTEM WITH A CURVED DELIVERY PATH

RELATED PROVISIONAL APPLICATION

This application claims the benefit of U.S. Provisional Patent Application Ser. No. 62/383,761, filed Sep. 6, 2016, and entitled "Filament Delivery Path for Wire Embedding Technologies used in 3D Printing."

CROSS-REFERENCE TO RELATED APPLICATION

This application is related to U.S. patent application Ser. No. 15/244,061, attorney docket number 2015-061, filed Aug. 23, 2016, entitled "Method and Apparatus for Wire Handling and Embedding on and Within 3D Printed Parts," U.S. Publication No. 2017/0064840, published Mar. 2, 2017, which is incorporated herein by reference in its entirety.

BACKGROUND INFORMATION

1. Field

The present disclosure relates generally to manufacturing objects and, in particular, to a method, apparatus, and system for embedding wires in a substrate during three-dimensional printing of the objects.

2. Background

Three-dimensional printing is an additive manufacturing process for making three-dimensional objects from digital computer models. This type of printing is often referred to as 3D printing. Other terms used to synonymously refer to 3D printing include additive manufacturing, layer manufacturing, rapid prototyping, layer-wise fabrication, solid freeform fabrication, and direct digital manufacturing.

In 3D printing, successive layers of a material are laid down adjacently to form objects. Material extrusion or fused deposition modeling typically involve a round or ribbon-like material that is extruded through a movable nozzle. The deposition of the layers forms a substrate that ultimately becomes the object when the process is complete.

The manufacturing method, since it deposits one layer or a fraction of a layer at a time, allows access to each individual layer. Opportunities arise when this access is provided. For example, complementary technologies can be introduced at every layer or even fractions of a layer to improve the functionality of the final part. Such complementary technologies include electronics, electromagnetic structures, or reinforcement structures. To include these technologies at every layer or on the surface of the 3D printed part, a direct wire embedding head is used to create wire patterns on and within 3D printed parts.

Wire embedding technologies for three-dimensional printing involve the delivery of wire from a material repository, such as a wire spool, to the interface between the tool embedding the wire and the substrate to which the wire is being embedded.

Technologies have been developed for wire embedding that use either, exclusively or in combination, ultrasonic energy, conductive thermal heating, or joule heating.

Challenges are present with embedding wires into a substrate. For example, inconsistencies may occur when embedding wires into a substrate during a 3D printing process. These inconsistencies include wire damage, wire breakage, out-of-tolerance wire placement, unacceptable wire depth, and other inconsistencies that may occur.

Therefore, it would be desirable to have a method and apparatus that take into account at least some of the issues discussed above, as well as other possible issues. For example, it would be desirable to have a method and apparatus that overcome a technical problem with inconsistencies occurring when embedding wires into a substrate during a 3D printing process.

SUMMARY

An embodiment of the present disclosure provides an apparatus that is comprised of a line embedding head and a curved channel within the line embedding head. The line embedding head has an input port and an output port. The input port is configured to receive a line. The output port is configured to output the line. The curved channel is in communication with the output port. The line is output from the output port at an angle relative to the line embedding head.

Another embodiment of the present disclosure provides a line embedding system that is comprised of an automation motion system and a line embedding head connected to the automation motion system. The line embedding head comprises a heating block having an input port, an output port, and a curved channel. The input port is configured to receive a line. The curved channel is in communication with the output port such that the line is output from the output port at an angle relative to a plane to the line embedding head. The line embedding head begins and terminates an embedded line pattern on a layer or on a surface of a substrate such that the embedded line pattern is automatically created in which a depth of the embedded line pattern is based on the angle at which the line is output from the output port.

Yet another embodiment of the present disclosure provides a method for embedding a line in a substrate. A line embedding head in positioned relative to a surface of the substrate. The line from an output port in the line embedding head is output at an angle relative to the embedding head such that the line is embedded in the substrate.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that a path or delivery conduit for a wire has an impact on the trajectory of the wire as the wire is embedded into the substrate. Also, the illustrative embodiments also recognize and take into account that the wire path can introduce undesirable resistance to wire driving.

The illustrative embodiments also recognize and take into account that a wire output at a line embedding head currently has an orientation that is perpendicular to the surface of the substrate in which the wire is to be embedded. The illustrative embodiments recognize and take into account that this orientation of the wire is a factor in the occurrence of inconsistencies such as line damage, line breakage, out-of-tolerance line placement, unacceptable line depth, and other inconsistencies.

The illustrative embodiments recognize and take into account that the depth at which a line is embedded is affected by the angle at which the line enters the substrate. The illustrative embodiments also recognize and take into account that the angle affects resistance to embedding. The illustrative embodiments recognize and take into account that, generally, a greater angle results in a greater depth and resistance to embedding. A lower angle results in a shallower depth and low resistance to embedding.

The illustrative embodiments recognize and take account that curved channels may be used to define wire paths that have an effect on the depth of wire embedding within the substrate and an effect on resistance to wire driving. The use of a curved channel for delivery of a line enables the embedding of materials of different stiffness, including those such as wire, carbon fiber tow, carbon nanotube yarn, polytetrafluoroethylene thread, optical fibers, or other suitable fibers that have a stiffness that is typically too low for practical line embedding in a substrate.

Thus, the illustrative embodiments recognize and take into account that the path or delivery conduit for the wire has an impact on the trajectory of the wire as the wire is embedded in the substrate. Also, the wire path can introduce undesirable resistance to wire driving. The following illustrative examples may be used to overcome these issues.

The wire path within the heated block of the tool may contain a linear and curved section, although each section may exist exclusively. With a curved section, the trajectory of the exiting wire can be manipulated to achieve deeper wire embedding, reduce the resistance to embedding, or both. For example, a curved section that allows the wire to exit, such that the wire is tangent to the substrate, results in lower resistance to embedding. This configuration also results in shallower embedding depth.

On the other hand, as the angle between the wire's long axis and substrate is increased, the wire is allowed to embed deeper into the surface, however, the resistance to embedding is increased. This angular relationship between the wire and the surface of the substrate can be used to accommodate the use of a wide range of wire diameters. That is, the angle can be decreased to accommodate the use of smaller diameter wires or filaments with low stiffness (e.g., carbon fiber tow, carbon nanotube yarn, para-aramid synthetic fiber thread, and optical fibers), which may not embed properly if the resistance to embedding is high enough such that the wire buckles within the wire path.

In addition, the channel forming the curved path could be coated with a low friction material, such as polytetrafluoroethylene or some other low-friction material, or a small tube with a smooth inside surface (e.g., hypodermic tube) that is shaped to the desired curve. Since this wire delivery method does not deliver the wire through the central axis of the tool, the tool can be used in combination with a rotation actuator to orient the tool in accordance with the tool's translation direction.

Thus, the illustrative embodiments provide a method, apparatus, and system for embedding a line in a substrate. In one illustrative example, an apparatus comprises a line embedding head having an input port and an output port, wherein the input port is configured to receive a line, and the output port is configured to output the line. The apparatus also includes a curved channel in communication with the output port, wherein the line is output from the output port at an angle relative to the line embedding head. The angle can be relative to a plane for the line embedding head. For example, the angle can be defined by an axis through the line and a plane that is coplanar with the surface of the substrate.

Figure 1:
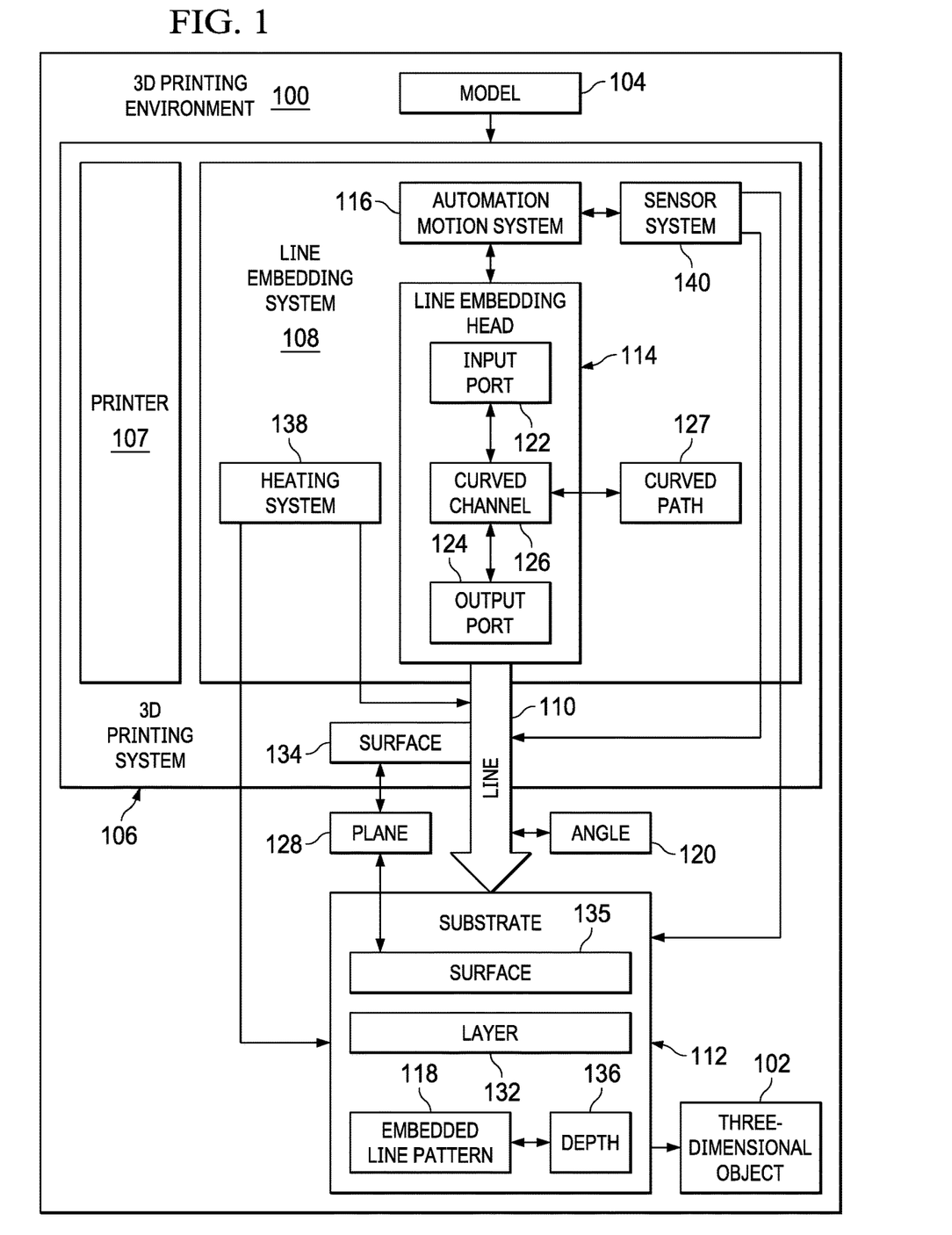
FIG. 1 is an illustration of a block diagram of a 3D printing environment in accordance with an illustrative embodiment.

With reference now to the figures and, in particular, with reference to FIG. 1, an illustration of a block diagram of a 3D printing environment is depicted in accordance with an illustrative embodiment. 3D printing environment 100 is used to manufacture three-dimensional object 102 from model 104 using 3D printing system 106.

Model 104 is a digital model such as a computer aided design (CAD) model, a point cloud, or some other suitable type of model. In this illustrative example, 3D printing system 106 includes printer 107, which is a device that creates three-dimensional object 102 by forming layers for substrate 112 to manufacture three-dimensional object 102. In this illustrative example, 3D printing environment 100 also includes line embedding system 108, which operates to embed line 110 into substrate 112. Although shown as part of 3D printing system 106, line embedding system 108 may be a separate component outside of 3D printing system 106 in other illustrative examples.

As depicted, substrate 112 is one or more layers of material laid up to form three-dimensional object 102. When all of the layers are laid up, substrate 112 forms three-dimensional object 102.

Line 110 may perform a number of different functions in three-dimensional object 102. For example, line 110 may conduct power for information through an electrical current, light, or some other suitable medium. As another example, line 110 may function as a heating element, a structural element, or some other suitable function within three-dimensional object 102.

In the illustrative example, line 110 may take a number of different forms. For example, line 110 is selected from a group comprising a wire, a filament, a stranded wire, a braided wire, a litz wire, a copper wire, a silver wire, a gold wire, a nichrome wire, a cable, a carbon fiber tow, carbon nanotube yarn, a para-aramid synthetic fiber, an optical fiber, a shape memory alloy line, a shape memory polymer line, a ribbon, an optical cable, or some other suitable type of line. When line 110 is a wire, line embedding system 108 is referred to as a wire embedding system.

In the illustrative example, line embedding system 108 includes a number of different components. As depicted, line embedding system 108 comprises line embedding head 114 and automation motion system 116.

As depicted, line embedding head 114 embeds line 110 into substrate 112. Line embedding head 114 is connected to automation motion system 116, which moves line embedding head 108 while line 110 is embedded in substrate 112.

As used herein, a first component, such as line embedding head 114, "connected to" a second component, such as automation motion system 116, means that the first component can be connected directly or indirectly to the second component. In other words, additional components may be present between the first component and the second component. The first component is considered to be indirectly connected to the second component when one or more additional components are present between the two components. When the first component is directly connected to the second component, no additional components are present between the two components.

In this illustrative example, automation motion system 116 may take a number of different forms. For example, automation motion system 116 may be selected from one of a three-axis gantry system, a four-axis motion system, a five-axis motion system, a robotic six-axis motion system, or some other suitable type of motion system.

This movement of line embedding head 114 by automation motion system 116 can be used to form embedded line pattern 118 in substrate 112 with line 110. Embedded line pattern 118 may be configured to function as at least one of radiating elements for antennas, interconnect for electronic components, thermal conduction paths, heating elements if the wire is made of nichrome or other electrically resistive material, reinforcements, sensors, or other suitable functions.

As used herein, the phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item B. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

The different types of lines may have different resistances to embedding. The resistance of line 110 may be based on factors such as diameter, material, or other suitable factors. Another factor in resistance is angle 120 at which line 110 is output from line embedding head 114 into substrate 112. As a result, the configuration of line embedding head 114 affects at least one of the resistance or depth for line 110 being embedding into substrate 112.

In this illustrative example, line embedding head 114 comprises input port 122, output port 124, and curved channel 126. Input port 122 is configured to receive line 110. Line 110 is received from a source such as a spool. Output port 124 is configured to output line 110.

As depicted, curved channel 126 within line embedding head 114 is in communication with output port 124. Curved channel 126 defines curved path 127 within line embedding head 114.

In this depicted example, line 110 is output from output port 124 at angle 120 relative to plane 128 for line embedding head 114. In this example, plane 128 is coplanar with surface 134 at the location on surface 134 where line 110 is output from line embedding head 114. Angle 120 also may be described as the angle between the long axis of line 110 and surface 135 of substrate 112.

With the process of embedding line 110, line embedding head 114 begins and terminates embedded line pattern 118 on layer 132 or on surface 135 of substrate 112 using line 110. In this illustrative example, angle 120 is such that embedded line pattern 118 is automatically created in which depth 136 of embedded line pattern 118 is based on angle 120 at which line 110 is output from output port 126 relative to substrate 112. Other factors can affect depth 136 of line 110 that is embedded in substrate 112. For example, other factors that impact depth 136 of line 110 that forms embedded line pattern 118 include at least one of the temperature of line 110, the temperature of substrate 112, relative velocity between line 110 and substrate 112, and other factors.

As depicted, angle 120 is selected based on at least one of a desired depth for the line embedded in substrate 112 or a desired amount of resistance to embedding line 110 in substrate 112. Further, angle 120 can be selected based on a group of parameters selected from at least one of line cross-sectional dimensions, a material, a stiffness of line 110, a temperature of substrate 112, a temperature of a heating block in line embedding head 114, a feed rate for line 110, a speed of line embedding head 114, or other suitable parameters. As yet another example, angle 120 can be selected to reduce at least one of line breakage or line damage.

As depicted, depth 136 increases as angle 120 increases. Resistance also increases as angle 120 increases.

In the illustrative example, the line cross-sectional dimensions describe cross-sections for line 110 in which the cross-sections may take various forms. For example, line 110 may have a cross-section selected from at least one of a circle, an ellipsoid, a rectangle, a square, a pentagon, a hexagon, or some other suitable cross-section. The cross-section also may be different along different portions of line 110. For example, part of line 110 may have a cross-section shape of a circle, while another part of line 110 may have a cross-section shape of an ellipsoid.

In the illustrative example, line embedding system 108 also may include heating system 138. Heating system 138 is configured to heat at least one of line 110 or substrate 112. Heating either or both of these components can increase the rate at which embedding of line 110 occurs in substrate 112. The heating can reduce the occurrence of inconsistencies.

Further, line embedding system 108 also may include sensor system 140. Sensor system 140 can be used by automated motion system 116 to move line embedding head 114 relative to substrate 112. In this manner, collision avoidance, line embedding, and other operations can be performed by automated motion system 116 with line embedding head 114. For example, sensor system 140 may be configured to measure a distance between line embedding head 114 and surface 134 of substrate 112. This measurement may be used by automation motion system 116 to move line embedding head 114 to embed line 110 in substrate 112.

Figure 2:
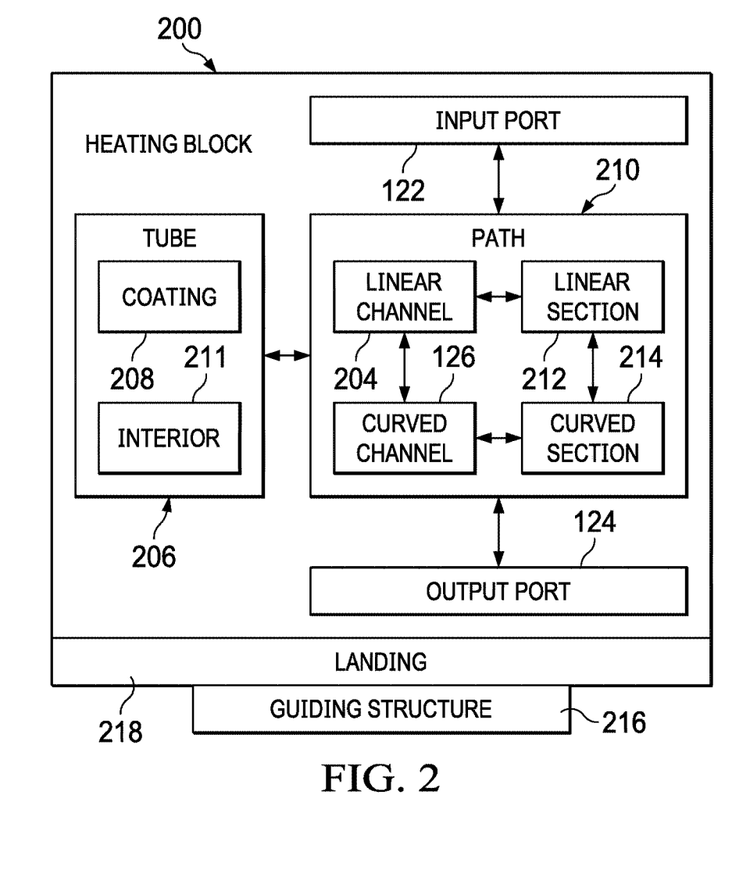
FIG. 2 is an illustration of a block diagram of a heating block in accordance with an illustrative embodiment.

With reference now to FIG. 2, an illustration of a block diagram of a heating block is depicted in accordance with an illustrative embodiment. In the illustrative examples, the same reference numeral may be used in more than one figure. This reuse of a reference numeral in different figures represents the same element in the different figures.

As depicted, heating block 200 is a component in line embedding head 114. Heating block 200 is thermally heated in this illustrative example. In turn, heating block 200 thermally heats line 110 in FIG. 1.

In this illustrative example, heating block 200 includes input port 122 and output port 124. Path 210 extends from input port 122 to output port 124. As depicted, curved channel 126 in heating block 200 forms path 210 and connects input port 124 and output port 126 to each other.

In another example, linear channel 204 is part of path 210 and is in communication with curved channel 126. Curved channel 126 has a cross-section shape that corresponds to line 110. For example, curved channel 126 may have the cross-section shape along the entire length of curved channel 126 or just a feature, for example, at output port 124 that assists in a specific orientation of line 110.

As depicted, linear channel 204 is the part of path 210 that connects curved channel 126 to input port 122. With linear channel 204 and curved channel 126 present in heating block 200, linear channel 204 defines linear section 212 in path 210, and curved channel 126 defines curved section 214 in path 210. In another illustrative example, one or more additional linear channels or curved channels also may be present within path 210 from input port 122 to output port 124.

Curved channel 126 may be comprised of tube 206, which may be located within heating block 200 in line embedding head 114. When curved channel connects input port 122 to output port 124, line 110 moves through tube 206 from input port 122 to output port 124. In another example, tube 206 may form linear channel 204 and curved channel 126. Tube 206 may be a hypodermic tube.

Further, coating 208 may be present within interior 211 of tube 206. Coating 208 reduces friction when moving line 110 through tube 206. Coating 208 may be comprised of a material that reduces friction. For example, coating 208 may be comprised of a number of materials selected from at least one of polytetrafluoroethylene, xylan, a ceramic, or some other suitable material. Tube 206 has a cross-section shape that corresponds to the cross-section shape of line 110. The cross-section shape may be present along the entire length of tube 206 or just a feature, for example, at output port 124 that assists in a specific orientation of line 110.

Additionally, heating block 200 also may include guiding structure 216. As depicted, guiding structure 216 is located on landing 218 on heating block 200. Landing 218 is configured to contact substrate 112 shown in block form in FIG. 1. Guiding structure 216 guides the wire as line 110 exits output port 124 for embedding into substrate 112.

With guiding structure 216, positional accuracy of wire patterns formed using line embedding system 108, shown in block form in FIG. 1, can be increased. In the illustrative example, guiding structure 216 may be selected from at least one of a channel, a rail, a flange, or some other suitable structure.

In this example, plane 128 is coplanar with surface 134 at the location on surface 134 where line 110 is output from heating block 200 in line embedding head 114.

Figure 3:
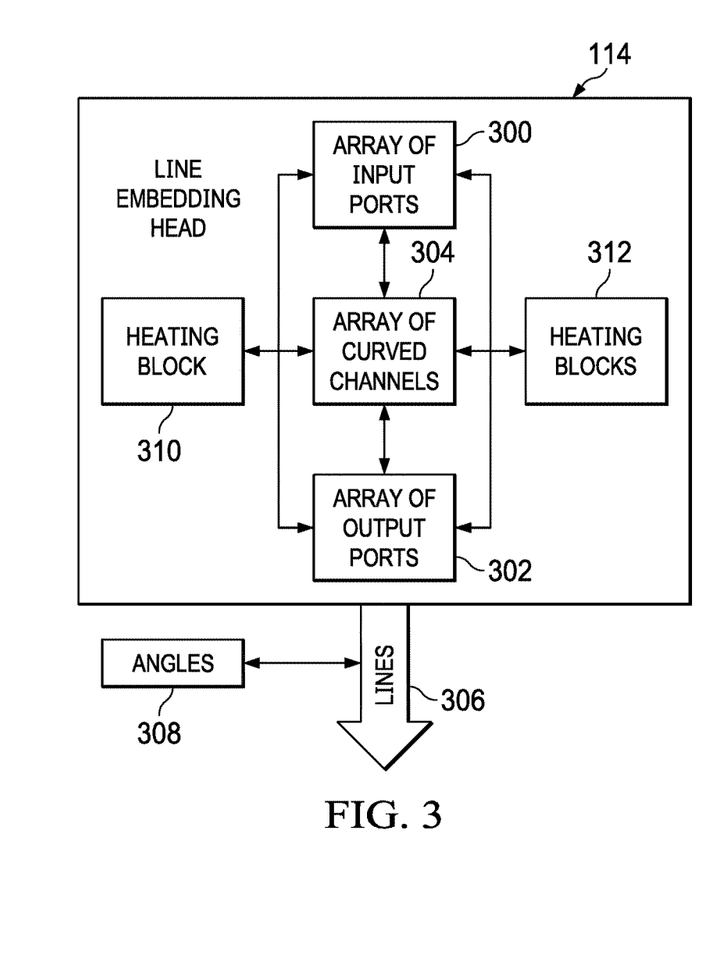
FIG. 3 is an illustration of a block diagram of a line embedding head in accordance with an illustrative embodiment.

With reference now to FIG. 3, an illustration of a block diagram of a line embedding head is depicted in accordance with an illustrative embodiment. As depicted, an example of components in line embedding head 114 is shown. In this illustrative example, line embedding head 114 includes array of input ports 300, array of output ports 302, and array of curved channels 304.

Array of input ports 300 is configured to receive lines 306 and array of output ports 302 is configured to output lines 306. Array of curved channels 304 is in communication with array of input ports 300 and array of output ports 304. Lines 306 are output from array of output ports 302 at angles 308 relative to line embedding head 114. Output ports in array of output ports 302 may be in parallel or some other arrangement.

As depicted in this example, array of input ports 300, array of output ports 302, and array of curved channels 304 are located in at least one of heating block 310, heating blocks 312, or line embedding heads, including line embedding head 114. For example, array of input ports 300, array of output ports 302, and array of curved channels 304 can all be located in heating block 310. In another example, each input port in array of input ports 300, each output port in array of output ports 302, and each curved channel in array of curved channels 304 may be a heating block in heating blocks 312. In another illustrative example, one heating block may include two input ports, two output ports, and two curved channels; while another heating block may contain a single input port, a single output port, and a single curved channel.

Angles 308 may be the same or different within heating block 310 or in heating blocks 312. When multiple heating blocks are used, the heating blocks can have array of curved channels 304 that provide the same or different angles.

In one illustrative example, one or more technical solutions are present that overcome a technical problem with inconsistencies occurring when embedding wires into a substrate during a 3D printing process. As a result, one or more technical solutions may provide a technical effect enable reducing inconsistencies. One or more technical solutions enable using different angles for lines being embedded into a substrate in a manner that may reduce at least one of out of tolerance wire placement, unacceptable wire depth, or other undesired results.

The illustration of 3D printing environment 100 and the different components in 3D printing environment 100 in FIGS. 1-3 are not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, multiple heating blocks may be present in addition to or in place of heating block 200 in which each heating block has a curved channel that results in a different angle from other heating blocks for line 110 exiting output port 124 being embedded in substrate 112. As a result, a particular heating block may be selected from the available heating blocks in which the particular heating block has a curved channel that provides a desired angle based on at least one of characteristics of line 110, substrate 112, desired depth, or other factors in embedding line 110 in substrate 112 to manufacture three-dimensional object 102.

As a result, different heating blocks may be switched in and out of line embedding head 114 to obtain a desired angle that is selected based on at least one of characteristics of line 110, characteristics of substrate 112, a desired depth, a desired resistance, or other suitable characteristics. In this manner, line embedding head 114 may be adaptable to perform different types of line embedding in different types of substrates.

Further, the illustrative example has been described with respect to a thermal line embedding head. Other illustrative examples may be implemented with wire embedding tools that use other energy sources in addition to or in place of heat. These other sources include, for example joule heating, ultrasonic energy, heated air, or some other suitable heating technique.

Figure 4:
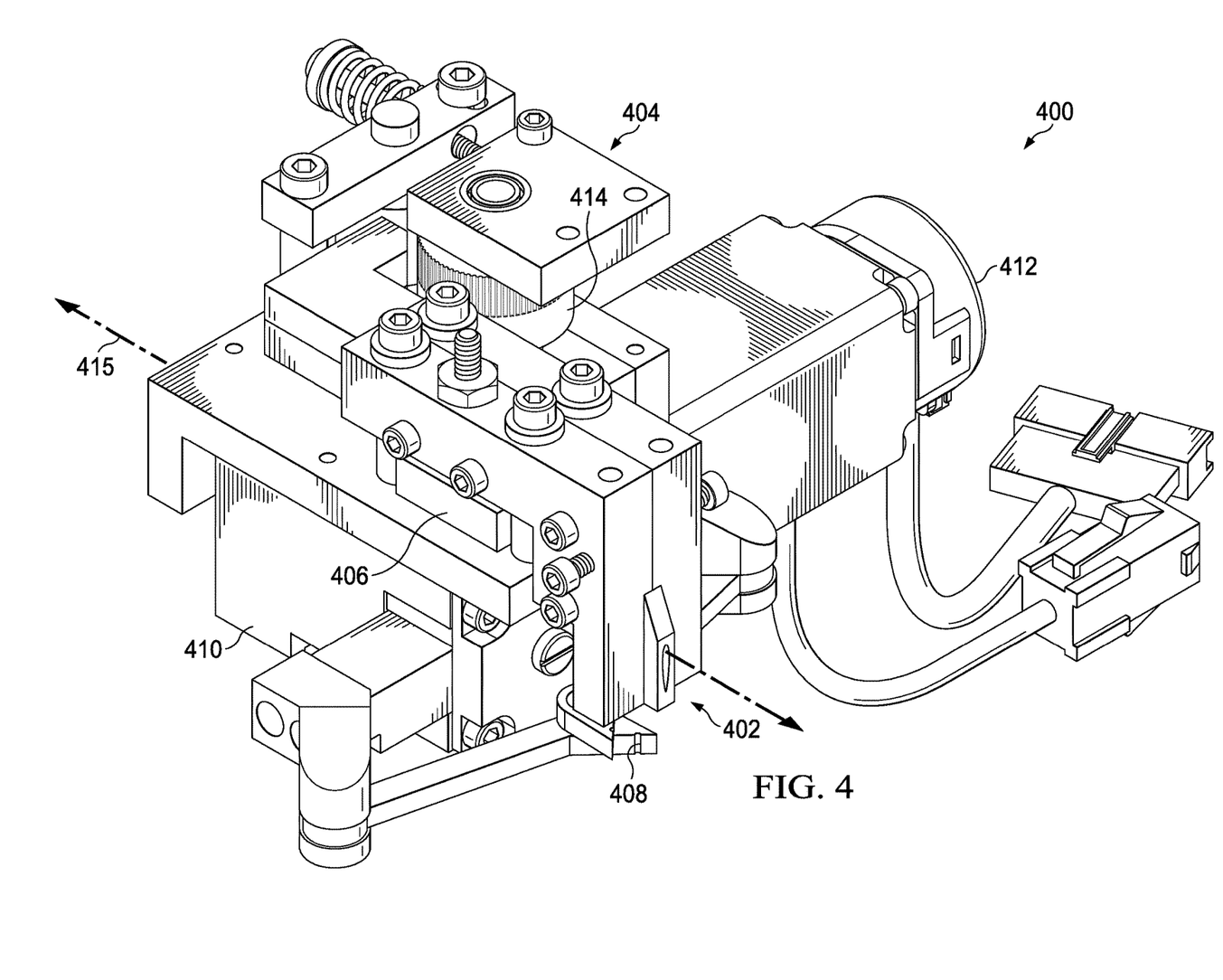
FIG. 4 is an illustration of a line embedding head in accordance with an illustrative embodiment.

With reference next to FIG. 4, an illustration of a line embedding head is depicted in accordance with an illustrative embodiment. In this figure, line embedding head 400 is an example of one physical implementation for line embedding head 114 shown in block form in FIG. 1. Line embedding head 400 may be an end effector for use with a robotic system, such as a robotic arm.

As depicted, line embedding head 400 includes heating block 402. Line embedding head 400 also includes pinch roller subassembly 404, calibration fastener 406, cutting shears 408, and actuator 410.

A line such as a wire, be driven by pinch roller subassembly 404. As depicted, pinch rollers 412 is actuated by motor 412. Typically, pinch roller subassembly 404 comprises drive roller 414, which is connected to motor 412, and an idler roller (not shown)

The position of heating block 402 relative to axis of rotation 415 of the line embedding system is adjusted by via calibration fastener 406. As depicted, calibration fastener 406 is adjusted to move the position of heating block 402. This positioning has an impact on the accuracy of the embedded line pattern created during line embedding.

For terminating a line, cutting shears 408 are used to shear the line in close proximity of output port 416. The cutting motion of cutting shears 408 is caused by actuator 418.

In this illustrative example, heating block 402 is an example of a physical implementation for heating block 200 shown in block form in FIG. 2 and heating block 310 shown in block form in FIG. 3. Heating block 402 is a component through which a line, such as a wire, may travel through and output from to be embedded in a substrate as part of a process to form an object using 3D printing.

Heating block 402 can be removed and another heating block with a different channel configuration can be connected to line embedding head 400. In this manner, line embedding head 400 is adaptable for different types of line embedding.

Figure 5:
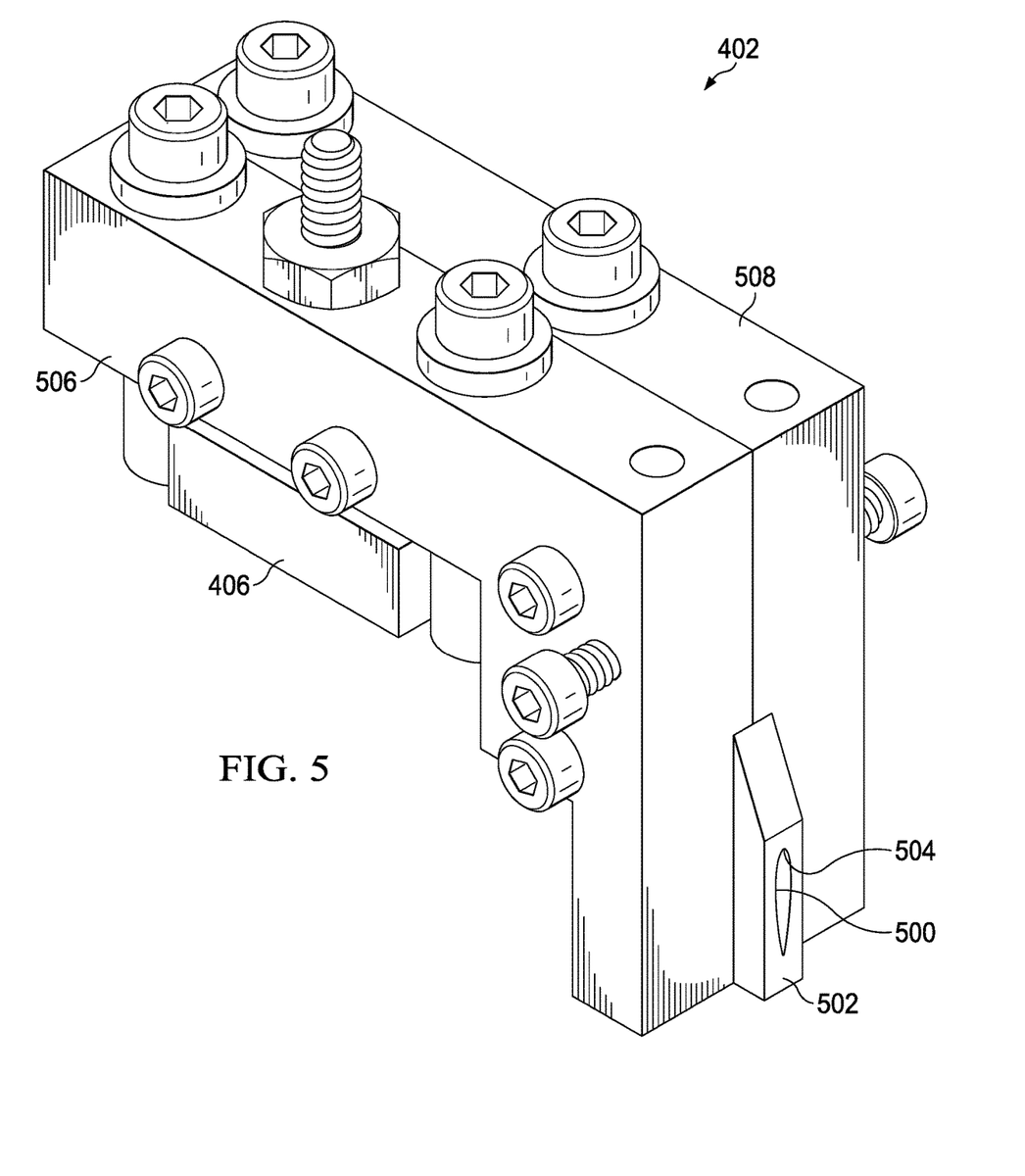
FIG. 5 is an illustration of a heating block in accordance with an illustrative embodiment.

Turning to FIG. 5, an illustration of a heating block is depicted in accordance with an illustrative embodiment. In this figure, heating block 402 has output port 500 on landing 502. Landing 502 is present on heating block 402 and is configured to contact a substrate when embedding a line, such a wire, into the substrate. In this view, guiding structure 504 can be used to guide a line being embedded in a substrate. In this illustrative example, heating block 400 is a two-piece structure comprising side 506 and side 508.

Figure 6:
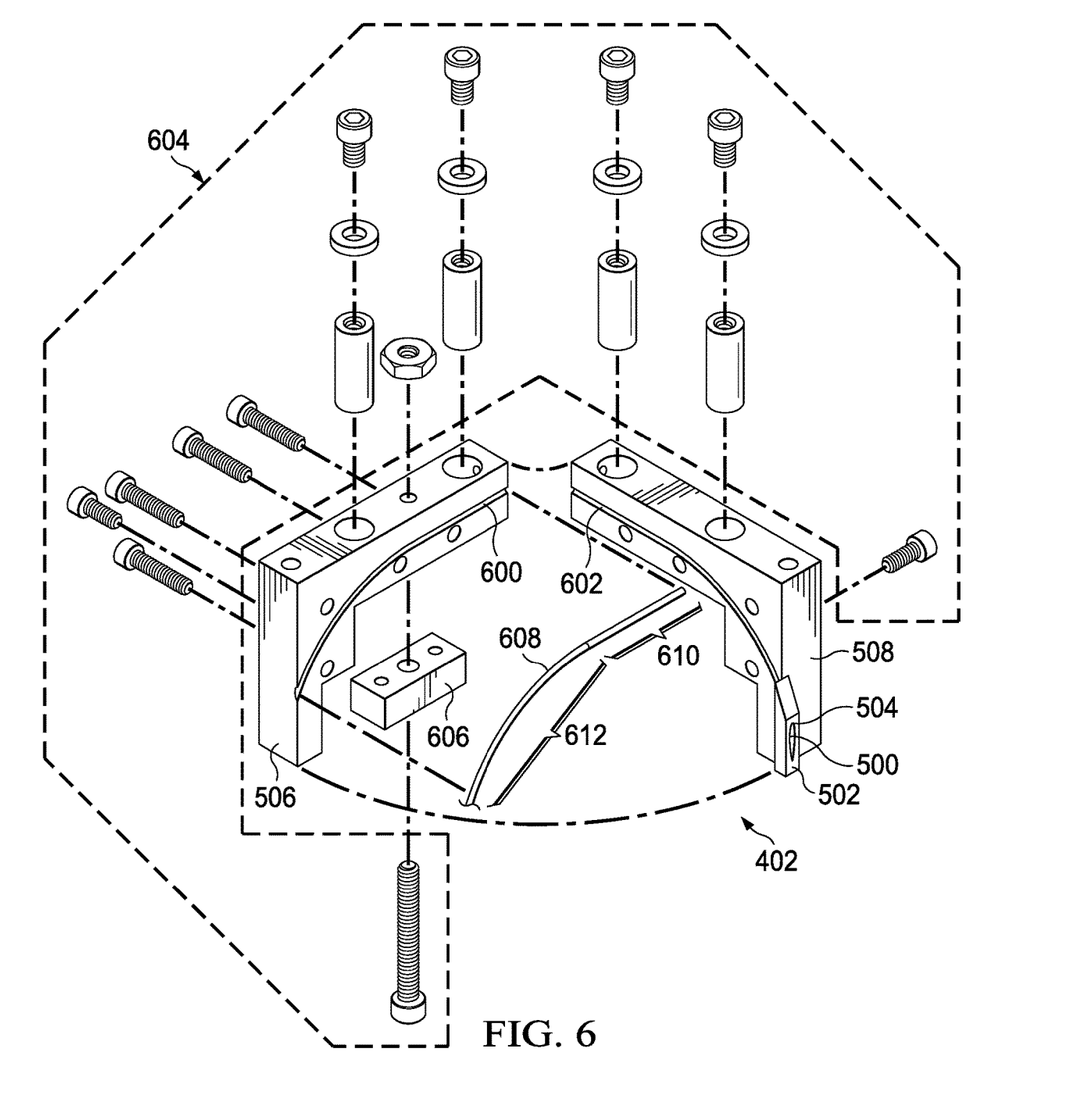
FIG. 6 is an illustration of an exploded view of a heating block in accordance with an illustrative embodiment.

With reference next to FIG. 6, an illustration of an exploded view of a heating block is depicted in accordance with an illustrative embodiment. In this view, raceways, raceway 600 and raceway 602, are seen. Raceway 600 is located in side 506, and raceway 602 is located in part 508 in this exploded view.

Also seen in this view are fasteners 604 and calibration fastener 406. In this illustrative example, calibration fastener 406 adjusts the position of the heating block 402 relative to the axis of rotation of the line embedding system. This feature enables maintaining the resulting dimensional accuracy of the embedded line pattern.

As depicted, tube 608 may fit within raceway 600 and raceway 602. Tube 608 has linear channel 610 and curved channel 612.

Figure 7:
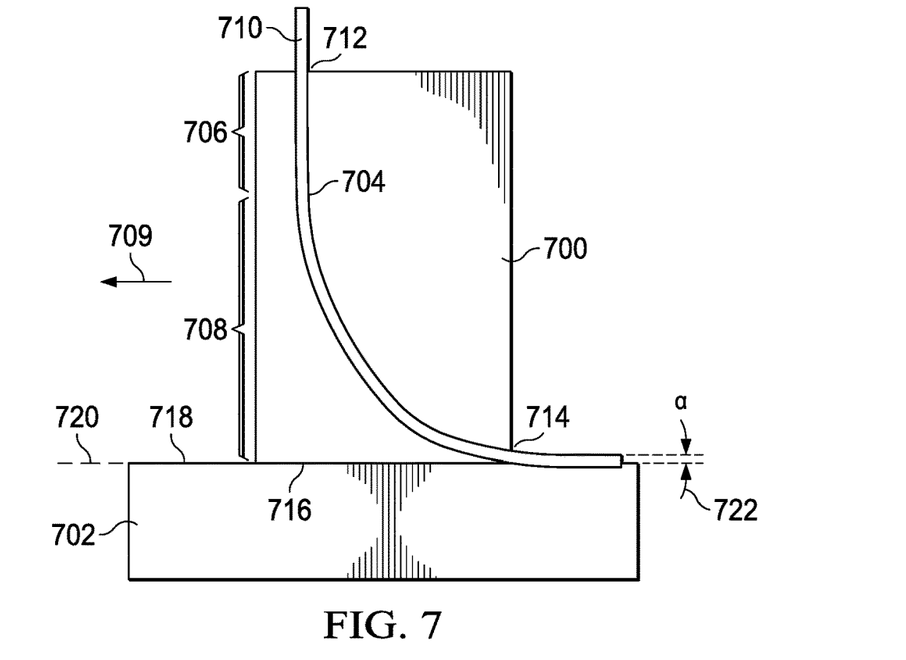
FIG. 7 is an illustration of a line embedded into a substrate from a heating block in accordance with an illustrative embodiment.
Figure 8:
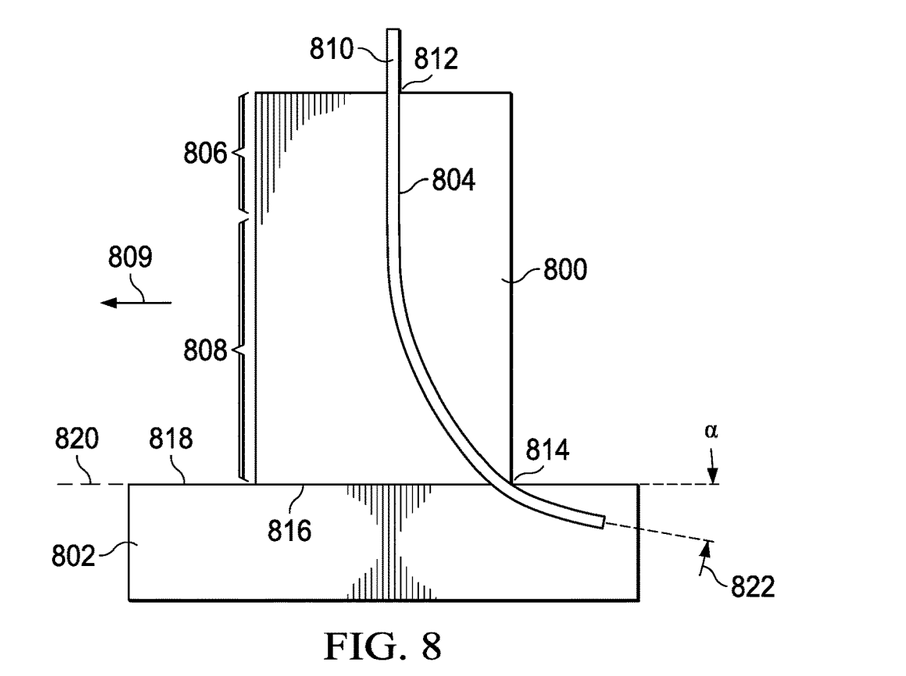
FIG. 8 is an illustration of a line embedded into a substrate from a heating block in accordance with an illustrative embodiment.

Turning to FIG. 7 and FIG. 8, illustrations of line embedding performed at different angles are depicted in accordance with an illustrative embodiment. With reference to FIG. 7, an illustration of a line embedded into a substrate from a heating block is depicted in accordance with an illustrative embodiment.

As depicted, heating block 700 is positioned on substrate 702. Path 704 is present within heating block 700. Path 704 comprises linear channel 706 and curved channel 708.

Wire 710 is moved through heating block 700 for embedding in substrate 702. Wire 710 is an example of a physical implementation for line 110 shown in block form in FIG. 1.

In this illustrative example, wire 710 enters block 700 at input port 712 and exits heating block 700 at output port 714. Landing 716 of heating block 700 is in contact with surface 718 of substrate 702. Plane 720 for heating block 700 is coplanar with landing 716 and surface 718 in this illustrative example. In some illustrative examples, surface 718 of substrate 702 may not be planar. For example, surface 718 of substrate 702 may be curved. With this example, landing 716 is positioned to be tangent to surface 718 of substrate 702.

As depicted, wire 710 exits heating block 700 at output 714 as heating block 700 moves in the direction of arrow 709. Wire 710 becomes embedded in substrate 702.

As depicted, wire 710 exits output 714 at angle a 722, which is an example of angle 120 shown in block form in FIG. 1. In this illustrative example, angle α 716 is about zero degrees.

Turning next to FIG. 8, an illustration of a line embedded into a substrate from a heating block is depicted in accordance with an illustrative embodiment. As depicted, heating block 800 is positioned on substrate 802. Path 804 in heating block 800 if formed by linear channel 806 and curved channel 808.

In this illustrative example, wire 810 is passes through heating block 800 for embedding in substrate 802 as heating block moves in the direction of arrow 809. Wire 810 enters heating block 800 at input port 812 and exits heating block 800 at output port 814.

As depicted, landing 816 of heating block 700 is in contact with surface 818 of substrate 802. Plane 820 for heating block 800 is coplanar with landing 816 in heating block 800 and with surface 818 on substrate 802 in this illustrative example.

As depicted, wire 810 exits output 814 at angle a 822, which is an example of angle 120 shown in block form in FIG. 1. Angle α 822 is the angle between plane 820 and wire 810. In this illustrative example, angle a 822 is greater than angle α 722 in FIG. 7.

In this example, deeper embedding and higher resistance is present in FIG. 8. FIG. 7 illustrates shallower embedding with low resistance as compared to FIG. 8.

The illustrations of the wire embedding at different angles in a substrate in FIG. 7 and FIG. 8 are meant only as examples of some implementations. These illustrations are not meant to limit the manner in which other illustrative examples may be implemented. For example, other angles may be used, such as 45 degrees, 53 degrees, 75 degrees, 80 degrees, or some other suitable angle.

As another example, other illustrative examples may be implemented using other energy sources other than a resistance heating element, as illustrated with heating block 700 in FIG. 7 and heating block 800 in FIG. 8. Further, the wire path defined by the channels within the heating block of the tool contain a linear section and curved section in FIG. 7 and FIG. 8. In some examples, a curved section may be present without the linear section.

With a curved channel in the path, the trajectory of the exiting wire can be manipulated to achieve deeper wire embedding or reduce the resistance to embedding. For example, in FIG. 7, curved channel 708 allows the wire to exit such that the wire is tangent to the substrate and results in lower resistance to embedding. This configuration also results in a shallower embedding depth.

On the other hand, as the angle between the wire's long axis and substrate is increased, the wire is allowed to embed deeper into the surface of the substrate. However, the resistance to embedding increases.

This angular relationship between the wire and the surface of the substrate can be used to accommodate the use of a wide range of wire diameters. In other words, the angle can be decreased to accommodate the use of smaller diameter wires, filaments, or other types of lines with low stiffness (e.g., carbon fiber tow, carbon nanotube yarn, Kevlar thread, optical fibers), which may not embed properly if the resistance to embedding is high and the wire buckles within the wire path.

Also, the angle can be decreased based on the stiffness of the materials in the line. As the stiffness increases, the angle may be decreased.

In addition, the curved path could be coated with a low friction material, such as polytetrafluoroethylene or some other low-friction material, or a small tube with a smooth inside surface (e.g., hypodermic tube) that is shaped to the desired curve. Since this wire delivery method does not deliver the wire through the central axis of the tool, the tool can be used in combination with a rotation actuator to orient the tool in accordance with the tool's translation direction.

Figure 9:
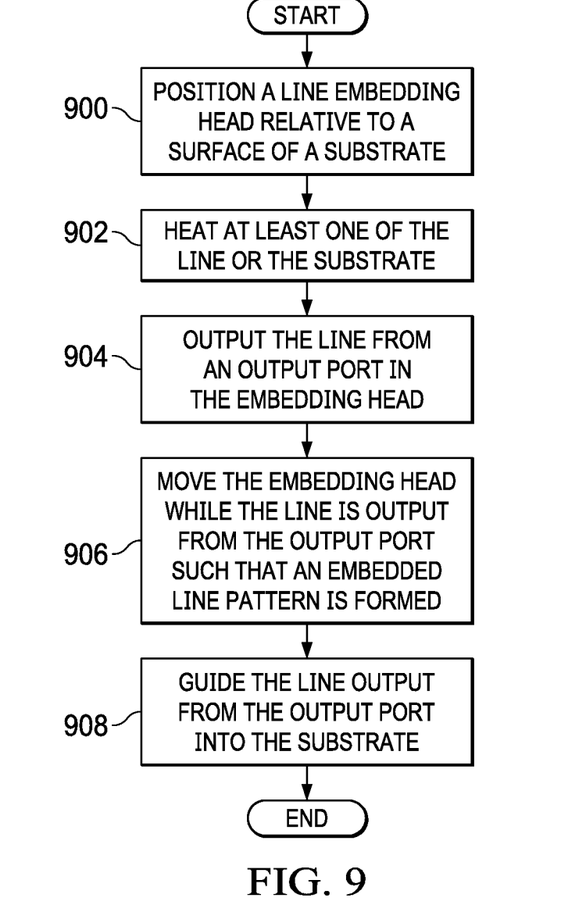
FIG. 9 is an illustration of a flowchart of a process for embedding a line in a substrate in accordance with an illustrative embodiment.

Turning next to FIG. 9, an illustration of a flowchart of a process for embedding a line in a substrate is depicted in accordance with an illustrative embodiment. The process illustrated in FIG. 9 may be implemented using line embedding system 108 in 3D printing environment 100 in FIG. 1.

The process begins by positioning a line embedding head relative to a surface of a substrate (step 900). The process heats at least one of the line or the substrate (step 902). Heating in step 902 may be performed in a number of different ways. For example, the heating may be performed using at least one of heating the substrate using at least one of conductive thermal heating, electrical resistance heating, conduction heating, convection heating, radiation heating, microwave heating, induction heating, joule heating, ultrasonic heating, air heating, or some other suitable heating technique.

The process outputs the line from an output port in the embedding head (step 904). In step 904, the line is output at an angle relative to the embedding head such that the line is embedded in the substrate. For example, the angle can be an angle relative to a plane to the embedding head such that the line is embedded in the substrate.

The process moves the embedding head while the line is output from the output port such that an embedded line pattern is formed (step 906). The process guides the line output from the output port into the substrate (step 908). The process terminates thereafter.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams may be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

For example, the heating performed in step 102 is optional and may be omitted in some illustrative examples. In another example, the step of guiding the line using a guiding structure is an optional step.

Thus, the illustrative examples provide a method, apparatus, and system for embedding a wire in a substrate formed for an object during 3D printing. For example, the apparatus may comprise a curved wire path defined by a curved channel that has an effect on the depth of wire embedding within a substrate and an effect on the resistance to wire driving. Embedding of these wires, filaments, or other types of lines enables the realization of line patterns that can serve as radiating elements for antennas, interconnect for electronic components, thermal conduction paths, heating elements if the wire is made of nichrome or other electrically resistive material, reinforcements, and sensors.

The description of the different illustrative embodiments has been presented for purposes of illustration and description and is not intended to be exhaustive or limited to the embodiments in the form disclosed. The different illustrative examples may be lied to various technologies in addition to 3D printing. For example, the different illustrative examples also may be applied to additive manufacturing, layer manufacturing, rapid prototyping, layer-wise fabrication, solid freeform fabrication and direct digital manufacturing. As a result, one or more illustrative examples also may be used in a method, apparatus, or system involving a filament delivery path for wire embedding technologies used in 3D printing, additive manufacturing, layer manufacturing, rapid prototyping, layer-wise fabrication, solid freeform fabrication, and direct digital manufacturing.

The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
a line embedding head having an input port and an output port, wherein the input port is configured to receive a line, and the output port is configured to output the line; and
a curved channel within the line embedding head, wherein the curved channel is in communication with the output port, and wherein the curved channel changes direction of output relative to direction of input such that the line is output from the output port at an angle relative to the line embedding head that differs from an angle of input into the input port, and wherein the line is output at a non perpendicular angle relative to surface of a substrate so that at least a portion of the line is embedded in the substrate.

2. The apparatus of claim 1, wherein the angle relative to the surface of the substrate is selected based on at least one of a desired depth for the line embedded in the substrate or a desired amount of resistance to embedding the line in the substrate.

3. The apparatus of claim 1, wherein the angle is selected based on a group of parameters selected from at least one of a line diameter, a material, a stiffness of the line, a temperature of a substrate, a temperature of a heating block in the line embedding head, a feed rate, or a speed of the line embedding head.

4. The apparatus of claim 1, wherein the angle is selected to reduce at least one of line breakage or line damage.

5. The apparatus of claim 1, further comprising:
a linear channel in communication with the curved channel.

6. The apparatus of claim 1, further comprising:
a heating block, wherein the curved channel is located within the heating block.

7. The apparatus of claim 6, further comprising:
a guiding structure located on a landing on the heating block that is configured to contact the substrate, wherein the guiding structure guides the line output from the output port as the line is embedded into the substrate.

8. The apparatus of claim 6, wherein the curved channel comprises:
a tube located within the heating block in the line embedding head, wherein the line moves through the tube from the input port to the output port.

9. The apparatus of claim 8, further comprising:
a coating on an interior of the tube such that the coating reduces friction when moving the line through the tube.

10. The apparatus of claim 8, further comprising:
an array of input ports and an array of output ports, wherein the array of input ports is configured to receive lines, and the array of output ports is configured to output the lines; and
an array of curved channels within the line embedding head, wherein the array of curved channels is in communication with the array of output ports and wherein the lines are output from the array of output ports at angles relative to the line embedding head.

11. The apparatus of claim 10, wherein the array of input ports, the array of output ports, and the array of curved channels are located in at least one of a heating block, heating blocks, or line embedding heads including the line embedding head.

12. The apparatus of claim 1, wherein the line is selected from a group comprising a wire, a filament, a stranded wire, a braided wire, a litz wire, a copper wire, a silver wire, a gold wire, a nichrome wire, a cable, a carbon fiber tow, carbon nanotube yarn, a para-aramid synthetic fiber, an optical fiber, a shape memory alloy line, and an optical cable.

13. A line embedding system comprising:
an automation motion system; and
a line embedding head connected to the automation motion system, wherein the line embedding head comprises a heating block having an input port, an output port, and a curved channel configured to change direction of output relative to direction of input; wherein the input port is configured to receive a line, and the curved channel is in communication with the output port such that the line is output from the output port at an angle relative to a plane to the line embedding head that differs from an angle of input into the input port; and
wherein the line is output at an non perpendicular angle relative to surface of a substrate so that at least a portion of the line is embedded in the substrate.

14. The line embedding system of claim 13, further comprising:
a sensor system configured to measure a distance between the line embedding head and the surface of the substrate.

15. The line embedding system of claim 13, further comprising:
a heating system configured to heat at least one of the line or the substrate.

16. The apparatus of claim 1, wherein output from the output port is tangential to a surface of a substrate.

17. The line embedding system of claim 13, wherein output from the output port is tangential to a surface of a substrate.

* * * * *